(12) United States Patent
Holland (10) Patent No.: US 6,396,764 B1
(45) Date of Patent: May 28, 2002

(54) SEGMENTED MEMORY ARCHITECTURE AND SYSTEMS AND METHODS USING THE SAME

(75) Inventor: Wayland Bart Holland, Dallas, TX (US)

(73) Assignee: Silicon Aquarius, Inc.

( * ) Notice: Subject to any disclaimer, the term of this patent is extended or adjusted under 35 U.S.C. 154(b) by 0 days.

(21) Appl. No.: 09/715,669

(22) Filed: Nov. 16, 2000

(51) Int. Cl.⁷ ................................................ G11C 8/00
(52) U.S. Cl. ........................... 365/230.03; 365/189.04; 365/207; 365/205; 365/204; 365/230.05
(58) Field of Search ....................... 365/230.01, 189.01, 365/230.03, 230.06, 207, 189.04, 204, 205, 230.05

(56) References Cited

U.S. PATENT DOCUMENTS

| | | | | |
|---|---|---|---|---|
| 5,796,669 A | * | 8/1998 | Araki et al. .................. | 365/222 |
| 6,094,396 A | * | 7/2000 | Zheng .................... | 365/230.03 |
| 6,118,715 A | * | 9/2000 | Arimoto ..................... | 365/205 |
| 6,125,421 A | * | 9/2000 | Roy .............................. | 711/5 |

FOREIGN PATENT DOCUMENTS

| | | | | |
|---|---|---|---|---|
| JP | 404212775 A | * | 8/1992 | |
| JP | 405074165 A | * | 3/1993 | |

* cited by examiner

*Primary Examiner*—Viet Q. Nguyen
(74) *Attorney, Agent, or Firm*—James J. Murphy, Esq.; Winstead Sechrest & Minick P.C.

(57) ABSTRACT

A memory 200 includes a first memory segment 302 comprising an array of rows and columns of memory cells, a selected column of cells in the first segment 302 accessed through a dedicated sense amplifier 304 associated with the first segment. A second memory segment 302 comprises an array of rows and columns of memory cells, a selected column of cells in the second memory segment 302 accessed through a dedicated sense amplifier 304 associated with the second segment. A Read Input/Output line 306*a* is coupled to the sense amplifier accessing the selected column of the first segment 302 for reading data from the first segment during a selected access cycle. A Write Input/Output line 306*b* is coupled to the sense amplifier 304 accessing the selected column of the second segment 302 for simultaneously writing data to the second memory segment 302 during the selected access cycle.

18 Claims, 6 Drawing Sheets

SEGMENTED MEMORY ARCHITECTURE AND SYSTEMS AND METHODS USING THE SAME

BACKGROUND OF THE INVENTION

1. Technical Field of the Invention

The present invention relates in general to electronic memories and in particular to a segmented memory architecture and systems and methods using the same

2. Description of the Related Art

Dynamic random access memory (DRAM) is the dominant type of memory used in personal computers (PCs) and similar applications. Among other things, DRAM is relatively less expensive, consumes less power, and has a higher bit density when compared with other types of memory, such as SRAM (static random access memory). As a result, advances in DRAM technology have until recently been driven by the needs of the personal computer (PC) market.

Notwithstanding, networked systems, such as the Internet, are rapidly becoming equally important applications of DRAM and have thus begun to drive changes in DRAM technology. For instance, the data profile across a network is essentially of a random access nature as data are switched and routed between endpoints. Typically, SRAM is used in the routers and switches forming the network backbone to reduce access time and consequently achieve high data rates, however, as already noted, DRAM is less expensive and consumes considerably less power than SRAM, although DRAM has traditionally been much slower than SRAM. Hence, there has been considerable interest in improving DRAM random access cycle time such that DRAM can be successfully applied to network switches and routers.

Thus, a need for arisen for a high-speed, low-power and relatively inexpensive dynamic random access memory for switching applications. In particular, these low-power, high-speed memories should be suitable for use in the switching elements of networked and similar data transfer systems.

SUMMARY OF THE INVENTION

According to one embodiment of the inventive concepts, a memory is disclosed which includes a first memory segment comprising an array of rows and columns of memory cells, a selected column of cells in the first segment accessed through a dedicated sense amplifier associated with the first segment. A second memory segment comprises an array of rows and columns of memory cells, a selected column of cells in the second memory segment accessed through a dedicated sense amplifier associated with the second segment. A Read Input/Output line is coupled to the sense amplifier accessing the selected column of the first segment for reading data from the first segment during a selected access cycle. Additionally, a Write Input/Output line is coupled to the sense amplifier accessing the selected column of the second segment for simultaneously writing data to the second memory segment during the selected access cycle.

The inventive concepts allow for the construction and operation of dynamic random access memories with substantially reduced access times. These dynamic memories are particularly suited for use in switching memory applications, which are presently dominated by static random access memory technologies. Dynamic memories typically provide more bits per chip area, are less expensive and consume substantially less power than the static types.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–6 of the drawings, in which like numbers designate like parts.

Figure 1:
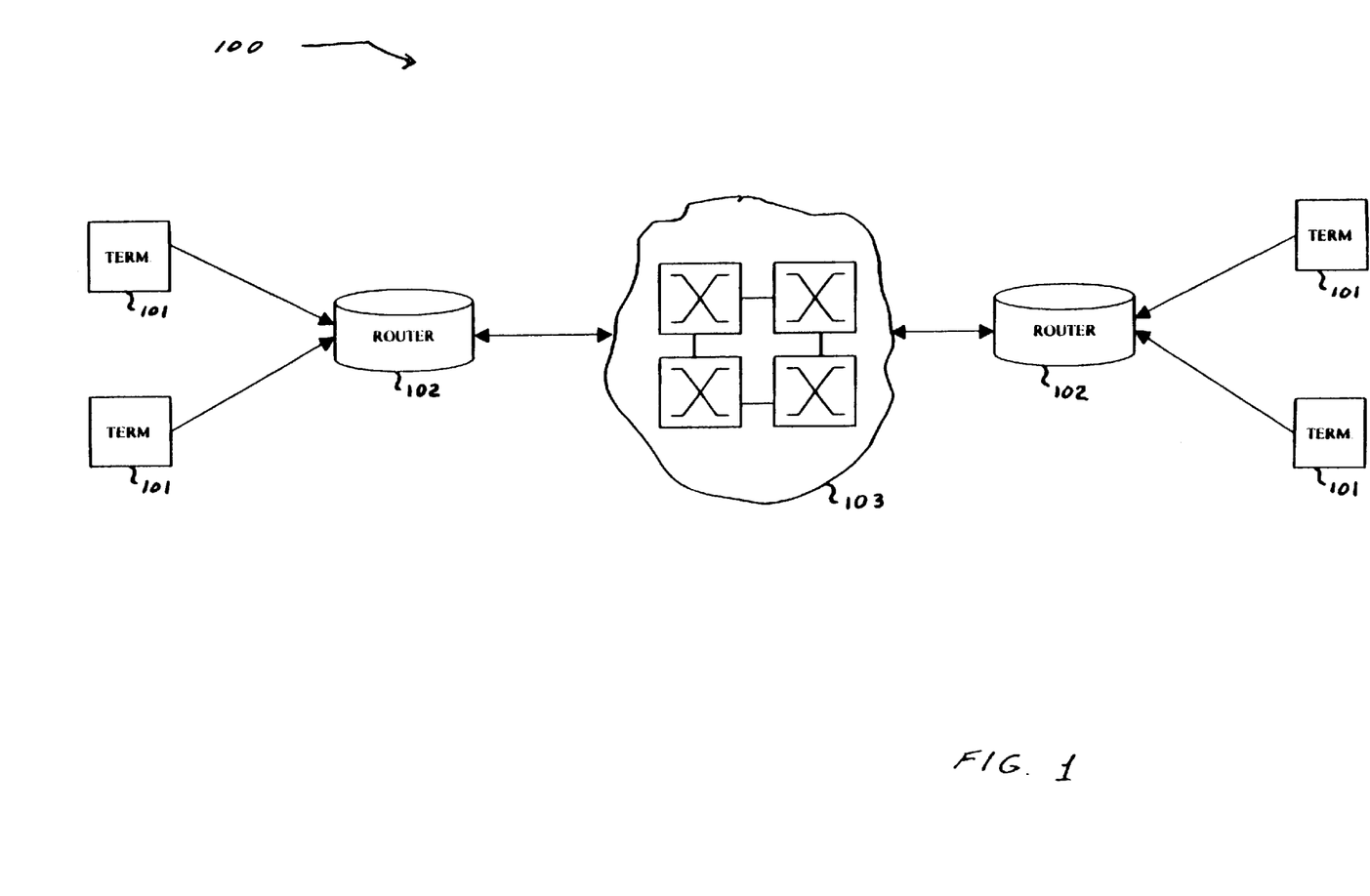
FIG. 1 is a high level functional block diagram of the major subsystems of an ATM network.

FIG. 1 is a high level functional block diagram of the major subsystems of an ATM network 100. In network 100, terminals 101 could be servers, personal computers, personal electronic appliances, larger computer systems, or other information processing devices and systems. In the illustrated network, raw data packets are generated, for instance in the Internet Protocol (IP), by a selected terminal 101 and sent to a router 102. In routers 102, routing tables, maintained by routing algorithms, contain route information which allow an optimum route to be chosen for the "next hop" through network 100 for a given packet. Specifically, when a cell arrives at a router 102, the router checks the destination address in the packet and associates that address with a path to the next node along the path using the routing table.

The packetized data are sent to an ATM interface in the source router 102. The interface segments the IP packets into ATM cells. A standard ATM cell is 53 bytes long, with the first 5 bytes being the header and the following 48 bytes being the payload. The header includes fields for flow control, virtual path and virtual channel identifiers, a payload type identifier, a congestion loss priority assignment and a header checksum value. The payload bytes contain the user data itself (voice, video or data), along with an adaptation layer.

For each ATM node the virtual channel identifier (VCI) and the virtual path identifier (VPI) are setup which define a virtual circuit with the next node in the network. Since the corresponding virtual path and virtual channel are valid only for the local point-to-point connection, they will be typically be remapped at the destination switches and routers after each hop. Moreover, since each node must establish a separate connection with each of the other nodes communicating with it, an operator configured permanent virtual circuit (PVC) or switched virtual circuit (SVC), set up by the ATM signaling protocol, are used to effectuate communications between endpoints 101.

ATM switches 103 receive cells along with their virtual channel and virtual path identifiers and compares those identifiers with a set of identifiers stored in a translation table in accordance with a switching algorithm. From the comparison, the switch outgoing ports are identified and the virtual channel and virtual path identifiers remapped as required to transmit each cell on its next hop.

Figure 2:
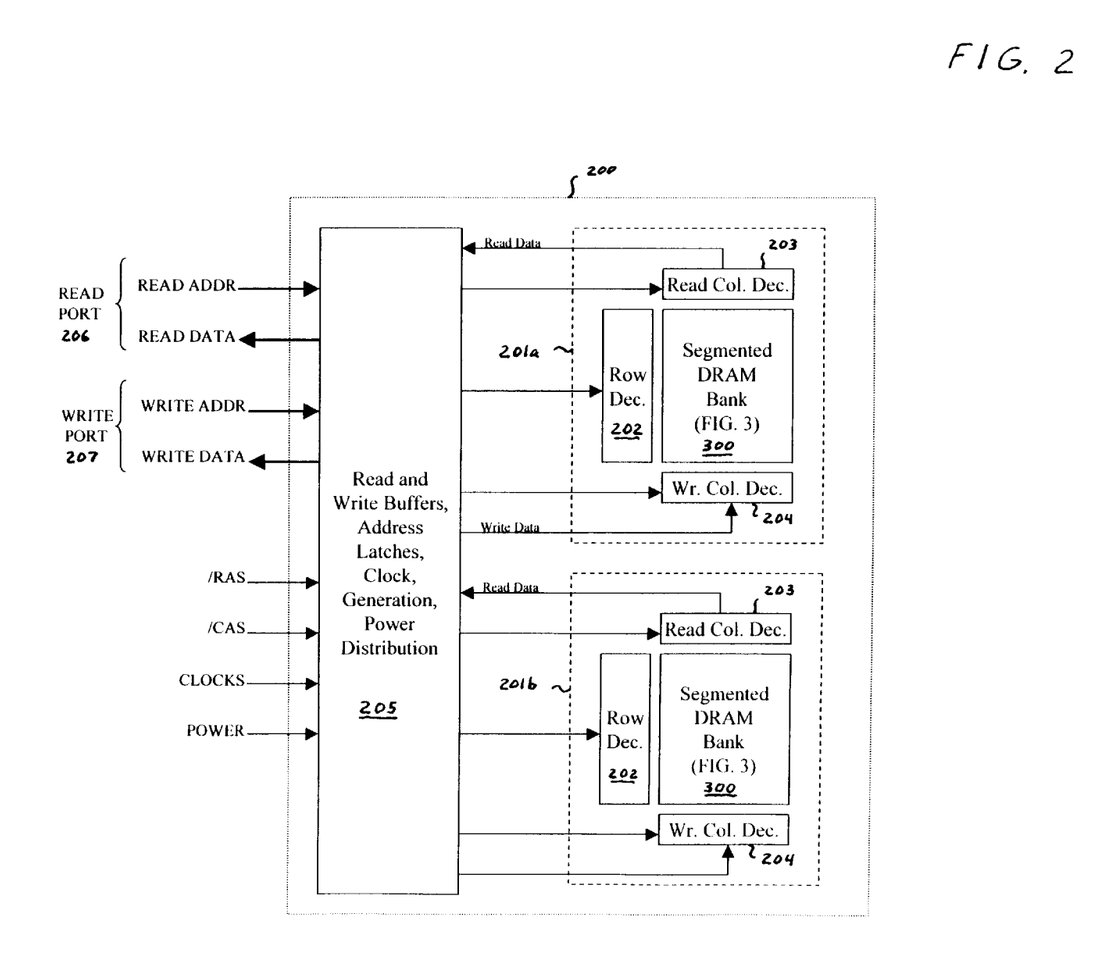
FIG. 2 is a high level functional block diagram of a memory suitable for use in a network switch or similar device or subsystem according to the inventive concepts.

FIG. 2 is a high level functional block diagram of a memory 200 suitable for use in a network switch or similar device or subsystem. As discussed further below, memory 200 is preferable based on dynamic random access memory cells (DRAM), of either the 1-transistor, 1-capacitor (1T-1C) or 2-transistor, 1-capacitor (2T-1C) types.

In the illustrated embodiment, memory 200 is organized around two banks 201a,b, each including a segmented memory array 300 (FIG. 3), row decoder circuitry 202, and read and write column decoders 203 and 204. Conventional read and write buffers, address latches, and clock and power distribution circuitry are shown generally as block 205. Note that memory 200 may have a single bank 201 or more than two banks 201, depending on the actual implementation. Multiple banks allow for interleaved precharge cycles which improves access latency.

Two ports, a Read Port 206 and a Write Port 207 are provided, each with a corresponding number of address and data lines. The number of address lines is generally a function of the size of the address space of memory 200 and the number of data lines a function of the desired data I/O width. For DRAMs, row and column address strobe (RAS and CAS are) inputs are supported as necessary, along the power and clock inputs. Memory 200 can be, in some embodiments, a synchronous device (SDRAM) operating in response to an appropriate master clock.

Figure 3:
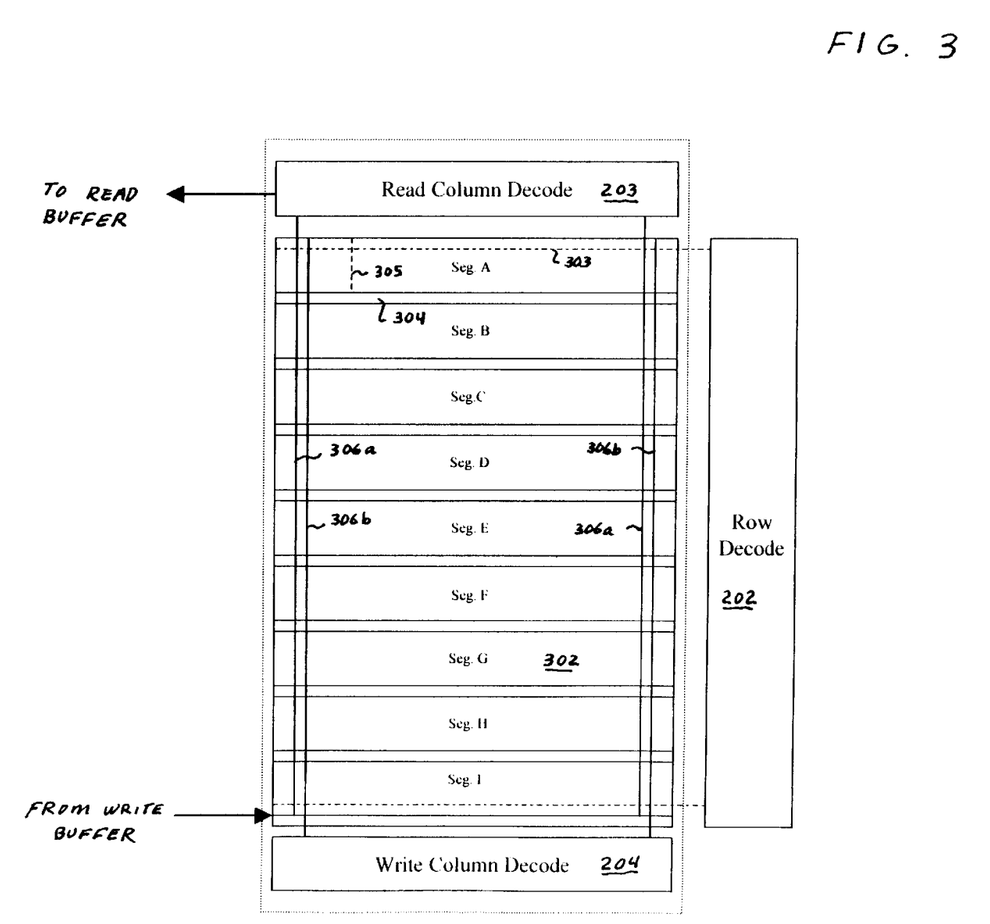
FIG. 3 is a more detailed diagram of one of the segmented DRAM arrays of the memory of FIG. 2, along with the supporting row and column decoders.

FIG. 3 is a more detailed diagram of one of the segmented DRAM arrays 300, along with the supporting row and column decoders. A DRAM embodiment based on 1T-1C cells, which has the advantage of higher bit-density, will be considered first.

As shown in FIG. 3, a array 301 of rows and columns of 1T-1C RAM cells is segmented into a plurality of segments 302. Each segment 302 comprises a given number of rows, each controlled by a wordline 303 which extends across all columns in the segment, and a dedicated set (array) of sense amplifiers 304 coupled to the bitline 305 associated with each column. In other words, for purposes of the present discussion, a "segment" is defined as the smallest memory partition having wordlines sharing bitlines and sense amplifiers.

In this example, 8 segments labeled Segments A–I are shown, although in actual implementations the number of segments may increase or decrease as a matter of design choice.

According to the inventive concepts, each sense amplifiers 304 is coupled to two sets of differential I/O line pairs 306. One I/O line pair 306a is designated the Read I/O and coupled to the Read Column decoder 203 and the other 306b designated as the Write I/O and coupled to the Write Column decoder 204, although the I/O line pairs are otherwise the same structurally. I/O lines 306a,b are precharged during the precharge cycle and reads and writes are performed differentially.

Figure 4:
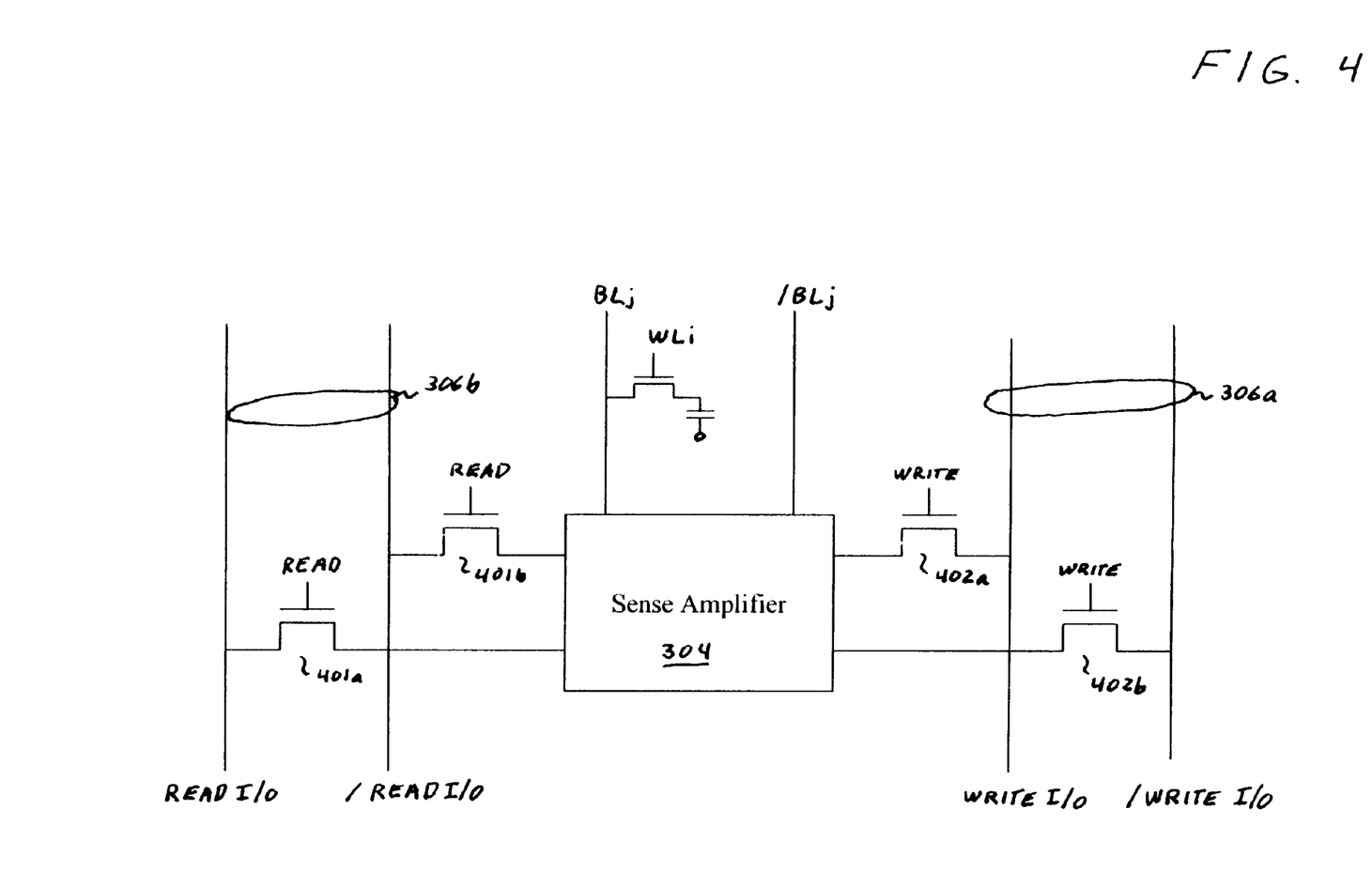
FIG. 4 is a more detailed block diagram illustrating one possible connection of the Input/Output lines with the sense amplifier arrays shown in FIG. 3 for an embodiment based on one-transistor, one-capacitor dynamic memory cells.

Exemplary connections of I/O pairs 306 to the sense amplifier are shown in further detailed in FIG. 4 for an arbitrarily selected column, Col(j) in the subarray. The control signals READ and WRITE are used to selectively couple the given sense amplifier 304 to the corresponding Read I/O or Write I/O lines 306a,b through a corresponding set of pass gates 401a,b or 402a,b. The pass gates can couple the I/O lines directly to the bitline BLi and its complement/BLi or to the cross-coupled nodes in a conventional sense amplifier. A single 1T-1C DRAM cell 403 is shown for reference coupled to the wordline WLi of the intersecting row Row(i). Note that while the exemplary bitline-sense amplifier organization has taken a folded-bitline form, a open-bitline organization can be also used in actual implementations.

The double I/O line configuration allows the access cycle time to array to be approximately halved. For example, if the nominal access cycle time to a conventional 1T-1C memory array is 16 ns, then the access time to a memory employing this inventive structure will nominally be 8 ns. This significant advantages is realized by accessing array 300 as follows.

Initially, all bitlines are precharged and equalized. A read address to one segment 302, assume Segment A, is received through Read Port 206 and decoded and the corresponding wordline activated. The data from the selected row is then latched in the Segment A sense amplifiers. The read data is then available through Read I/O 306a lines and Read Column decoder 203.

At the same time, a write address to another segment, assume Segment Bi is received through Write Port 207 and decoded and the corresponding wordline activated. In the preferred embodiment, the read address has priority to access a given segment 302. The Write Address is then directed to the next available free space which is not in the same segment subject to the read operation. (If all the remaining segments in the normal memory space are "full" and cannot accommodate the write operation, then the "extra segment" discussed below is used for the write.) The corresponding data is driven onto the Write I/O lines 300b through the Segment B sense amplifiers.

At then end of the simultaneous read and write operations, the bitlines in all segments 302 of the array are returned to precharge, along with the I/O lines 306a,b.

The ability to perform simultaneous read and write operations are particularly useful in system applications, such as switch memories, where data are stored and retrieved using sequences of reads and writes. This is especially true when the rate data that is input into the buffer is substantially the same as the rate data that is output from the buffer. This feature is illustrated in the timing diagram of FIG. 5. Specifically, the depicted timing is typically used during network switching environments such as those discussed above in conjunction with FIG. 1.

Figure 5:
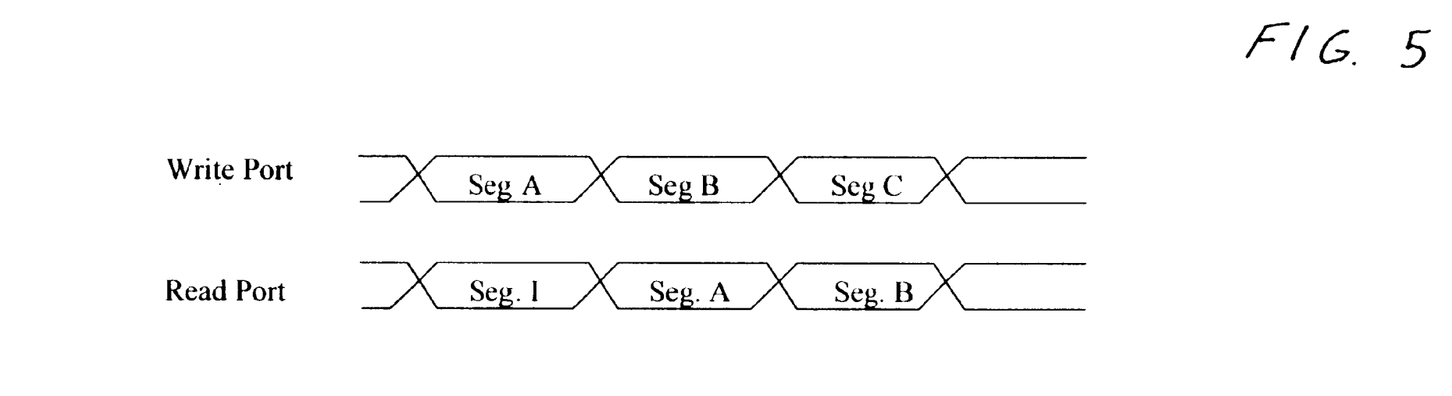
FIG. 5 depicts the timing diagram showing the ability to perform simultaneous read and write operations.

In sum, the access time to the array is approximately halved, when sequences of simultaneous reads and writes, such as those shown in FIG. 5, are being performed.

For example, consider the case where the nominal access time for a conventional single port configuration (with a single set of I/O lines per sense amplifier) is 16 nsec. Here, only a single write or single read operation can be performed to the array every 16 nsec, such that a read followed by a write (or a write followed by a read) requires nominally 32 nsec. In contrast, according to the inventive concepts, both a read and a write operation can be performed to the array simultaneously, and therefore the effective access time is reduced to 8 nsec.

If two segmented arrays 301 are used, the access time can be further reduced. In this case, one array is used for the Read operation and the other for the Write operation.

Figure 6:
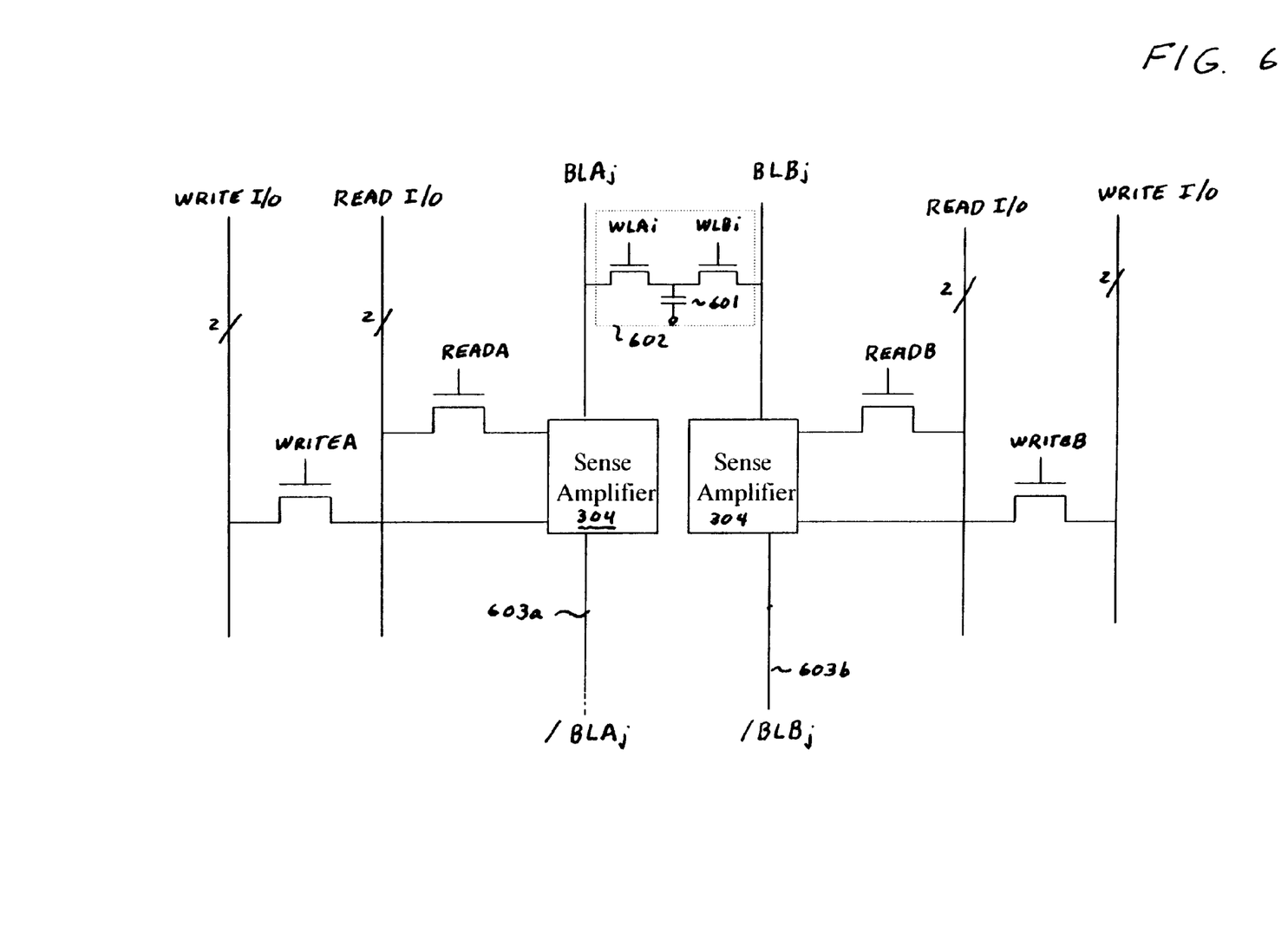
FIG. 6 is a more detailed block diagram illustrating one possible connection of the Input/Output lines with the sense amplifier arrays shown in FIG. 3 for an embodiment based on two-transistor, one-capacitor dynamic memory cells.

According to another aspect of the inventive concepts, the segments having space free to be written to are tracked with a write pointer in a first-in-first-out register. Reads can then be simultaneously made to any segments "behind" the write pointer. Additionally, an "extra" segment may be included such that a full block of memory space is available for writes. For example, in FIG. 3, nine segments 302 are shown. If each segment has a capacity of 2Mbits, the total capacity for the array is 18 Mbits. If one 2 Mbit segment is used for a read, then a full 16 Mbits of memory are available for the simultaneous write, and vice versa, Additionally, the inventive concepts can be applied to systems and devices using 2T-1C memory cells. In these embodiments, as shown in FIG. 6 each storage capacitor 601 of each cell 602 in Column(j) is accessible two bitlines 603a,b, respectively labeled BLjA or BLjB, through a pair of wordlines WLiA and WLiB, associated with intersecting Row (i). A complete description of a preferred 2T1C memory cells is found in coassigned U.S. Pat. No. 5,856,940 by Rao entitled "LOW LATENCY DRAM CELL AND METHOD THEREFOR" granted Jan. 5, 1999.

The use of 2T-1C cells allows for transparent precharge of a single memory bank. For example, while simultaneous reads and writes are being performed to two different memory segments using bitlines BLjA and wordlines WLiA, the second set of bitlines BLjB can be put into precharge, and vice versa. Effectively, accesses and precharges are interleaved between sets of bitlines such that the access time to the bank is roughly halved. Banks in turn can also be interleaved or simultaneously accessed to further reduce the access latency.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. A memory comprising:
   a first memory segment comprising an array of rows and columns of two-transistor, one-capacitor memory cells, each column associated with first and second bitlines, a selected column of cells in the first segment accessed through a dedicated sense amplifier coupled to the first bitline associated with the selected column of the first segment;
   a second memory segment comprising an array of rows and columns of columns of two-transistor, one-capacitor memory cells, each column associated with first and second bitlines, a selected column of cells in the second segment accessed through a dedicated sense amplifier coupled to the first bitlines associated with the selected column of the second segment;
   a read input/output line coupled to the sense amplifier accessing the first bitline of the selected column of the first segment for reading data from the first segment during a selected access cycle, the second bitline of the selected column of the first segment being substantially simultaneously precharged; and
   a write input/output line coupled to the sense amplifier accessing the first bitline of the selected column of the second segment for simultaneously writing data to the second memory segment during the selected access cycle, the second bitline of the selected column of the second segment being substantially simultaneously precharged.

2. The memory of claim 1 wherein said cells of a selected one of the first and second segments comprises an array of one-transistor, one-capacitor dynamic random access memory cells, the cells of each column coupled to a bitline and each bitline associated with a sense amplifier.

3. The memory of claim 1 wherein said cells of a selected one of the first and second segments comprises an array of two-transistor, one-capacitor dynamic random access memory cells, the cells of each column coupled to a pair of bitlines each associated with a sense amplifier.

4. The memory of claim 1 and further comprising:
   a read column decoder coupled to the read input/output line; and
   a write column decoder coupled to the write input/output line.

5. The memory of claim 1 and further comprising:
   a read port including data and address lines for transferring data read from the first segment to an external device; and
   a write port including data and address lines for writing data to the second 6. The memory of claim 1 wherein the read and write input/output lines are each one line of a pair of differential input/output lines.

7. The memory of claim 1 wherein the first and second memory segments are fabricated on a single integrated circuit chip.

8. A method of accessing a memory including a cell array partitioned into a plurality of segments, each segment including a dedicated set of sense amplifiers and each sense amplifier coupled to a read line and a write line, comprising the steps of:
   during a selected memory cycle, reading from a first selected one of the segments through the read line;
   during the selected memory cycle, substantially simultaneously writing data from a second selected one of the segments through the write line;
   substantially simultaneously precharging the first and second segments of the cell array during a precharge cycle;
   accessing a second array substantially simultaneously with the step of precharging, the second array partitioned into a plurality of segments each including a set of sense amplifiers coupled to a read line and a write line comprising the substeps of:
      during a selected memory cycle, reading from a first selected one of the segments of the second array through the read line; and
      during the selected memory cycle, writing to a second selected one of the segments of the second array through the write line.

9. The method of claim 8 and further comprising tracking free space within the plurality of segments with a pointer in a first-in-first-out register.

10. The method of claim 8 wherein the segments comprise a plurality of columns of two-transistor, one-capacitor memory cells, each column associated with first and second bitlines, and said steps of reading and writing comprise the substeps of reading and writing to the first bitline and substantially simultaneously precharging the second bitline.

11. A memory system comprising:
   an segmented array of two-transistor, one-capacitor memory cells memory cells comprising a plurality of segments, each segment comprising:
      a selected number of rows and columns of memory cells, the cells of a selected row coupled to at least one wordline and the cells of a selected column coupled to first and second bitlines; and a plurality of sense amplifiers coupled to said first bitlines of said segment;

a plurality of read lines each coupled to a selected sense amplifier in each of said plurality of segments;

a plurality of write lines each coupled to a selected sense amplifier in each of said plurality of segments;

addressing circuitry for reading cells in a row in a first one of said segments through said read lines and said first bitlines of said columns of said first one of said segments and simultaneously writing to cells in a row in a second one of said segments through said write lines and said first bitlines of said columns of said second one of said segments; and control circuitry for precharging the second bitlines of said columns of said first and and second ones of said segments substantially simultaneous to the reading and writing through said first bitlines of said columns of said first and second ones of said segments.

12. The memory system of claim 11 wherein said addressing circuitry comprises row decoder circuitry operable to activate a wordline in said first segment and simultaneously a wordline in said second segment.

13. The memory system of claim 11 wherein said addressing circuitry comprises a read column decoder coupled to said read lines and a write column decoder coupled to said write lines.

14. The memory system of claim 11 wherein said memory cells of a selected said segment comprise dynamic random access memory cells.

15. The memory system of claim 14 wherein said dynamic random access memory cells comprising one-transistor, one-capacitor memory cells.

16. The memory system of claim 14 wherein said rows of said selected segment comprise first and second wordlines and said columns of said selected segment comprise first and second bitlines and said memory cells of said selected segment comprise two-transistor, one-capacitor memory cells.

17. The memory system of claim 14 and further comprising read and write ports for communicating with an external device.

18. The memory system of claim 17 wherein said ports each include address and data lines.

* * * * *